United States Patent
Wang et al.

(10) Patent No.: US 9,627,220 B1
(45) Date of Patent: Apr. 18, 2017

(54) METHODS OF MANUFACTURING SEMICONDUCTOR DEVICES WITH IMPROVED METAL GATE FILL-IN FOR VERTICAL MEMORY CELL AND DEVICES THEREOF

(71) Applicant: MACRONIX INTERNATIONAL CO., LTD., Hsin-Chu (TW)

(72) Inventors: Jr-Meng Wang, Hsinchu (TW); Chih-Yuan Wu, Hsinchu (TW); Kuanf-Wen Liu, Hsinchu (TW); Jung-Yi Guo, Tainan (TW); Chun-Min Cheng, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 14/932,546

(22) Filed: Nov. 4, 2015

(51) Int. Cl.
| H01L 21/311 | (2006.01) |
| H01L 27/115 | (2006.01) |
| H01L 29/66 | (2006.01) |
| H01L 27/11524 | (2017.01) |
| H01L 27/1157 | (2017.01) |
| H01L 27/02 | (2006.01) |

(52) U.S. Cl.
CPC .... *H01L 21/31111* (2013.01); *H01L 27/0207* (2013.01); *H01L 27/1157* (2013.01); *H01L 27/11524* (2013.01)

(58) Field of Classification Search
CPC ............ H01L 29/788; H01L 29/42324; H01L 2924/13085; H01L 2924/13081; H01L 29/78391; H01L 27/11517; H01L 29/787; H01L 29/792; H01L 29/6684
See application file for complete search history.

(56) References Cited

U.S. PATENT DOCUMENTS

| 2010/0038699 A1 | 2/2010 | Katsumata et al. |
| 2014/0220750 A1* | 8/2014 | Sohn ............... H01L 27/11556 438/269 |
| 2015/0200199 A1 | 7/2015 | Sakamoto et al. |
| 2015/0348799 A1* | 12/2015 | Hong .................. C09K 13/04 438/268 |

FOREIGN PATENT DOCUMENTS

| TW | 574351 | 2/2004 |
| TW | 2014-34138 A | 9/2014 |
| TW | 201434138 | 9/2014 |
| TW | 2015-16264 A | 5/2015 |

OTHER PUBLICATIONS

Jang, J. et al. "Vertical cell array using TCAT(Terabit Cell Array Transistor) technology for ultra high density NAND flash memory." 2009 Symposium on VLSI Technology, Honolulu, HI, Jun. 16-18, 2009, pp. 192-193.

* cited by examiner

*Primary Examiner* — Thomas L Dickey
*Assistant Examiner* — Damon Hillman
(74) *Attorney, Agent, or Firm* — Alston & Bird LLP

(57) ABSTRACT

Provided are improved semiconductor memory devices and methods for manufacturing such semiconductor memory devices. The methods may include two or more nitride removal steps during formation of gate layers in vertical memory cells. The two or more nitride removal steps may allow for wider gate layers increasing the gate fill-in, reducing the occurrence of voids, and thereby improving the word line resistance.

15 Claims, 10 Drawing Sheets

METHODS OF MANUFACTURING SEMICONDUCTOR DEVICES WITH IMPROVED METAL GATE FILL-IN FOR VERTICAL MEMORY CELL AND DEVICES THEREOF

FIELD

Embodiments of the present invention generally relate to a semiconductor device, and methods of preparing the semiconductor device.

BACKGROUND

A flash memory device generally includes an array of memory cells arranged in rows and columns. Each memory cell includes a transistor structure having a gate, a drain, a source, and a channel defined between the drain and the source. The gate corresponds to a word line, and the drain or source correspond to bit lines of the memory array.

The semiconductor industry is increasingly driven towards smaller and more capable electronic devices, such as computing devices, communication devices, and memory devices. In order to increase the capacity of the devices, three-dimensional ("3D") or vertical memory cell arrays have been formed comprising multiple vertical layers of gates along a substrate.

Applicant has identified deficiencies and problems associated with conventional processes for manufacturing vertical memory cells and the resulting memory devices. Through applied effort, ingenuity, and innovation, certain of these identified problems have been solved by developing solutions that are included in various embodiments of the present invention, which are described in detail below.

SUMMARY

Embodiments of the present invention therefore provide methods of manufacturing semiconductor devices useful in the manufacture of memory devices and provide semiconductor memory devices resulting from such methods.

The present invention provides methods of manufacturing a vertical memory cell comprising providing a substrate; forming a plurality of alternating gate insulating layers and nitride layers; etching one or more channels orthogonal to the plurality of alternating gate insulating layers and nitride layers; and performing a first nitride removal step using a phosphoric acid reagent comprising silicon. In certain embodiments, the method further comprises a second nitride removal step.

In certain embodiments, the first nitride removal step comprises applying the reagent to the plurality of alternating gate insulating layers and nitride layers at about 140-160° C. In some embodiments, the second nitride removal step comprises applying the reagent to the plurality of alternating gate insulating layers and nitride layers at about 140-160° C.

In some embodiments, the reagent in the first nitride removal step has a nitride to gate insulating layer etching rate of about 100:1 to 60:1. In certain embodiments, the first nitride removal step comprises applying a reagent to the plurality of alternating gate insulating layers and nitride layers, wherein the reagent has a nitride to gate insulating layer etching rate of about 80:1.

In some embodiments, the reagent in the second nitride removal step has a nitride to gate insulating layer etching rate of about 100:1 to 60:1. In some embodiments, the reagent in the second nitride removal step comprises phosphoric acid. In such embodiments, lower gate insulating layer loss was found after second nitride removal step. In certain embodiments, the first nitride removal step comprises applying a reagent, wherein the reagent comprises a silicon concentration of about 80 ppm, while in some embodiments, the second nitride removal step comprises applying a reagent, wherein the reagent comprises a silicon concentration of about 120 ppm.

Still further, in certain embodiments of manufacturing a vertical memory cell, performing the first nitride removal step comprises forming one or more rounded edges of one or more gate insulating layers. In some embodiments, at least a portion of one or more gate insulating layers and nitride layers is removed to form one or more spaces along the alternating layers, wherein the spaces are about 400 Å wide.

In certain embodiments, the method comprises forming metal gate layers where nitride layers have been removed. In some embodiments, the metal gate layers comprise tungsten, and in certain embodiments, the gate insulating layers comprise oxide.

In certain embodiments, the method comprises forming an oxide-nitride-oxide layer where nitride layers have been removed. For instance, an oxide-nitride-oxide layer may be deposited after the first nitride removal step, such as specifically after the second nitride removal step.

In certain embodiments, the method further comprises depositing conductive material, such as polysilicon, in the one or more channels.

As aspect of the invention also provides a vertical memory cell comprising a substrate; a plurality of alternating gate insulating layers and gate layers disposed along the substrate; and one or more channels orthogonal to the plurality of alternating gate insulating layers and nitride layers, wherein the gate insulating layers have one or more rounded edges. In some embodiments, the vertical memory cell comprises metal gate layers comprising tungsten. In some embodiments, the vertical memory cell comprises gate insulating layers comprising oxide.

In certain embodiments, the rounded edges of the gate insulating layers in the memory cell are formed due to application of a reagent to the memory cell in forming the gate layers.

In some embodiments, the vertical memory cell comprises one or more channels comprising conductive material. In certain embodiments, the conductive material in the one or more channels is polysilicon.

In certain embodiments, at least one of the channels has a radius smaller than a radius of a second channel. Still further, in some embodiments, at least one channel has a gradient distribution such that a radius of the channel is smaller at the bottom of the channel compared to a radius of the channel at the top of the channel.

The above summary is provided merely for purposes of summarizing some example embodiments of the invention so as to provide a basic understanding of some aspects of the invention. Accordingly, it will be appreciated that the above described example embodiments are merely examples and should not be construed to narrow the scope or spirit of the invention in any way. It will be appreciated that the scope of the invention encompasses many potential embodiments, some of which will be further described below, in addition to those here summarized.

BRIEF DESCRIPTION OF THE DRAWING(S)

Having thus described the invention in general terms, reference will now be made to the accompanying drawings, which are not necessarily drawn to scale, and wherein:

Figure 4:
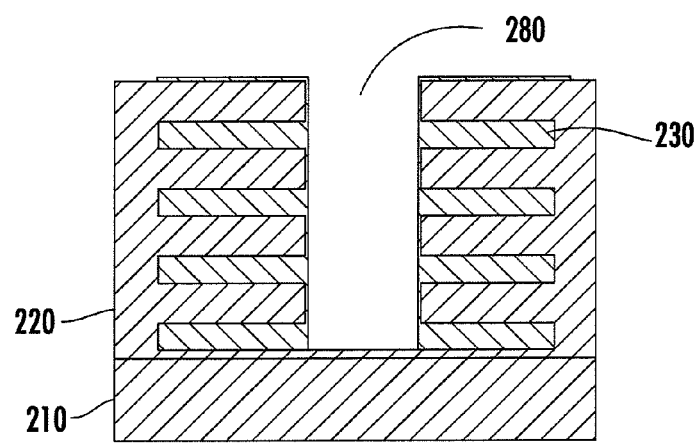
Figure 5:
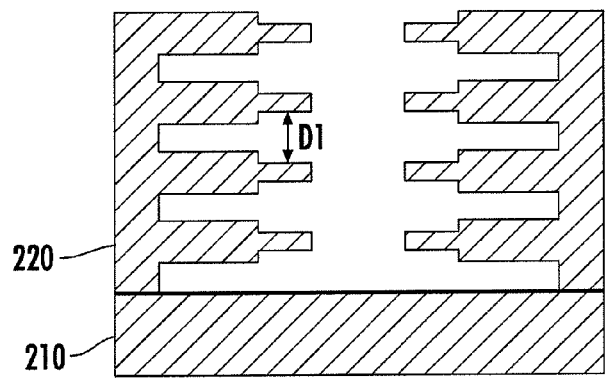
Figure 6A:
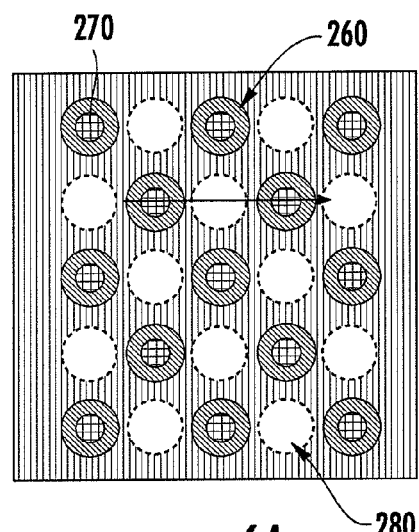
Figure 6B:
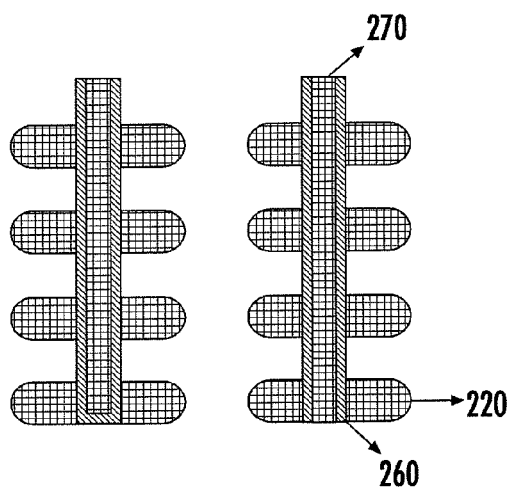
Figure 7:
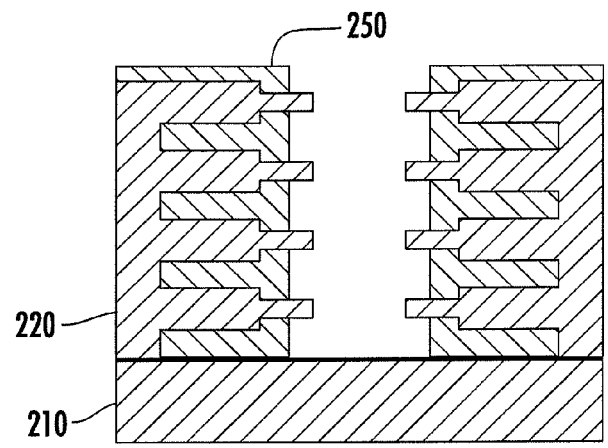
Figure 8A:
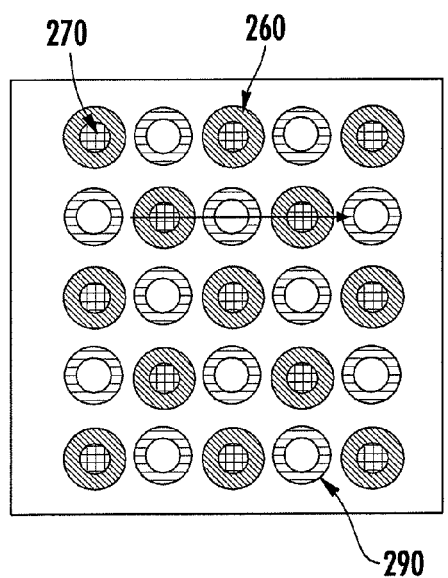
Figure 8B:
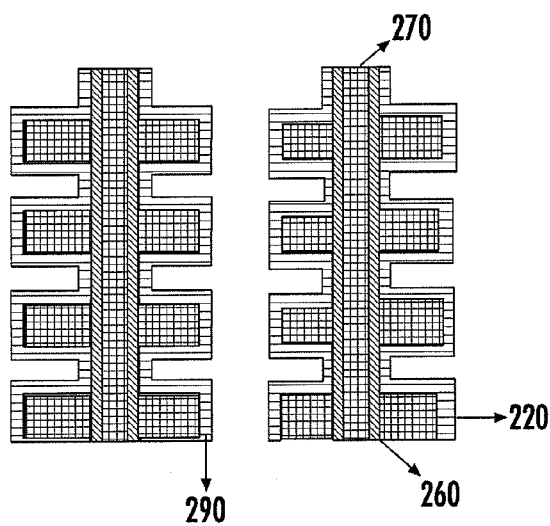
Figure 9A:
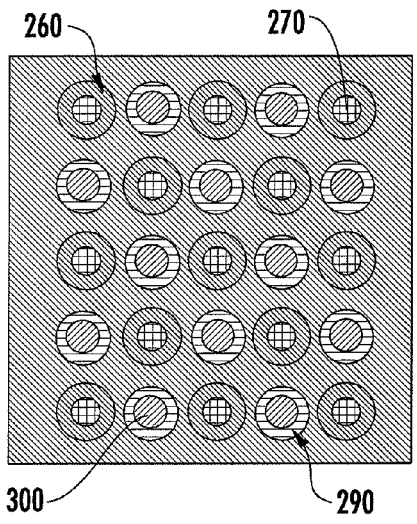
Figure 9B:
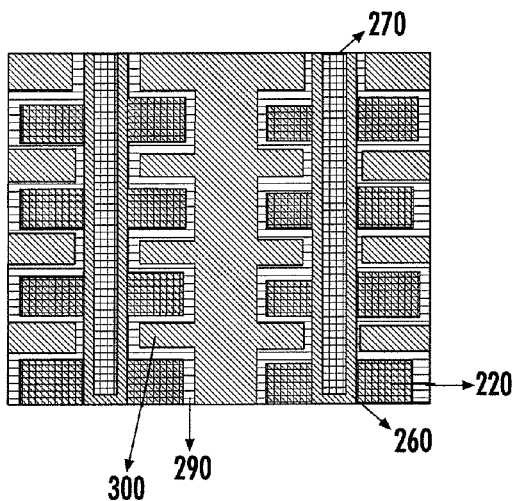
Figure 10A:
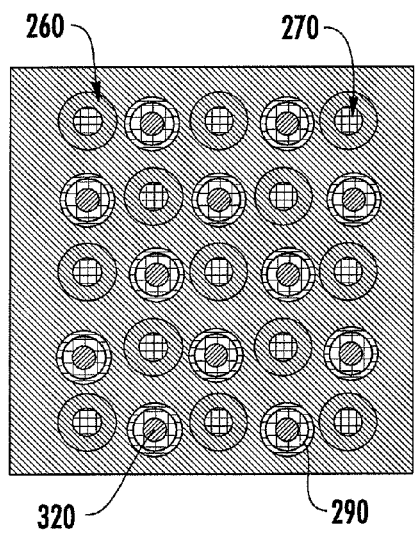
Figure 10B:
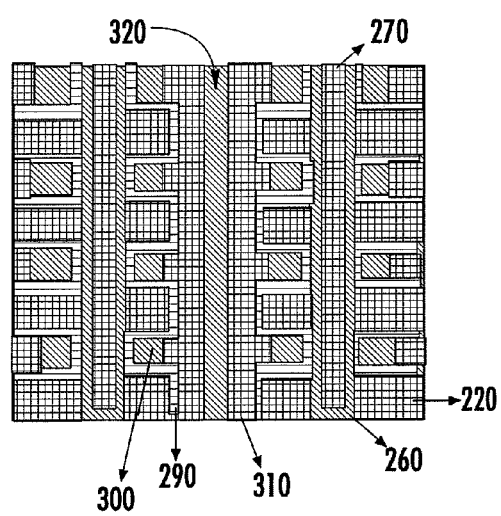
Figure 11A:
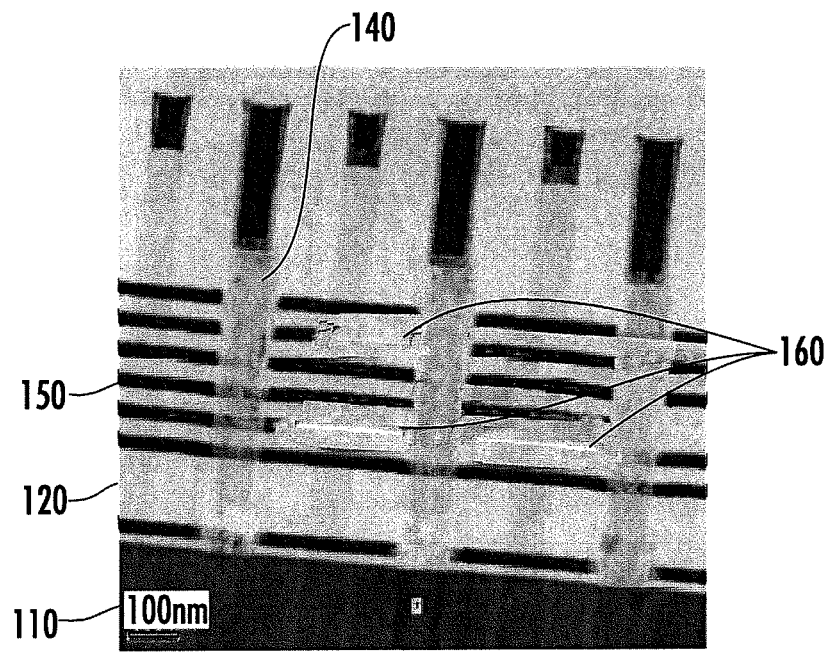
Figure 11B:
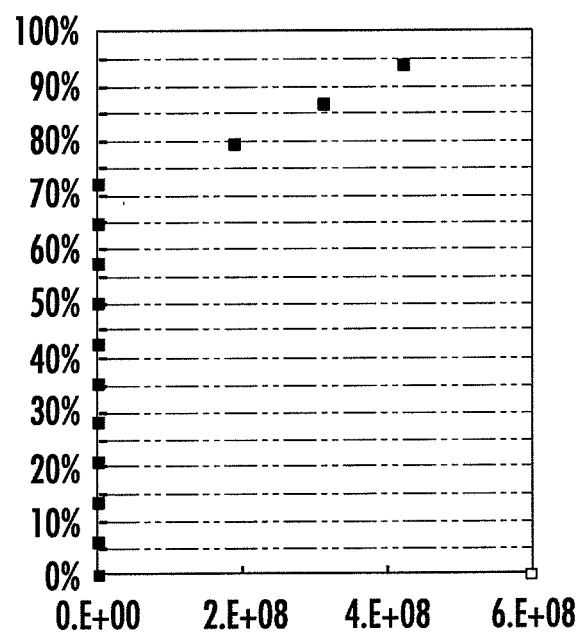
Figure 12A:
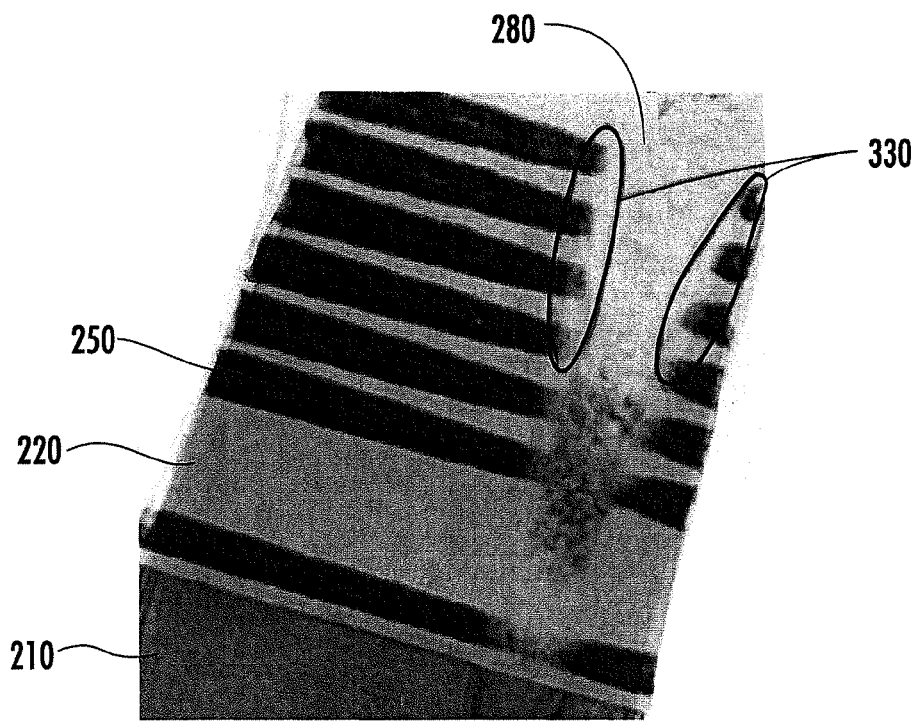
Figure 12B:
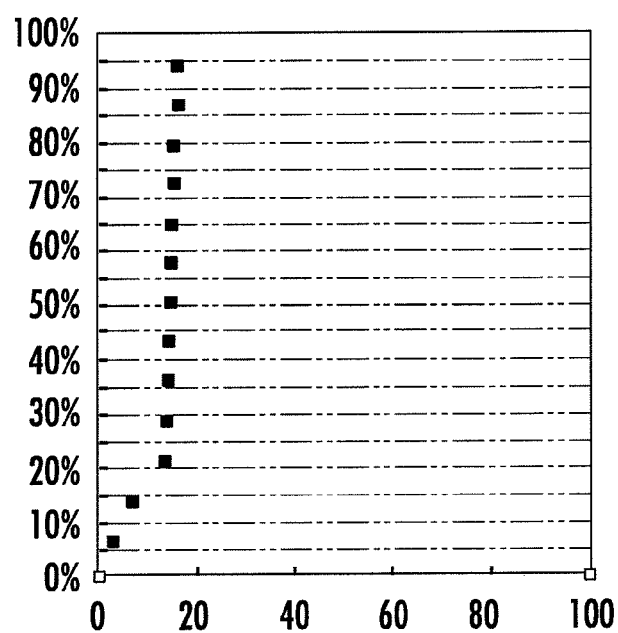
Figure 13:
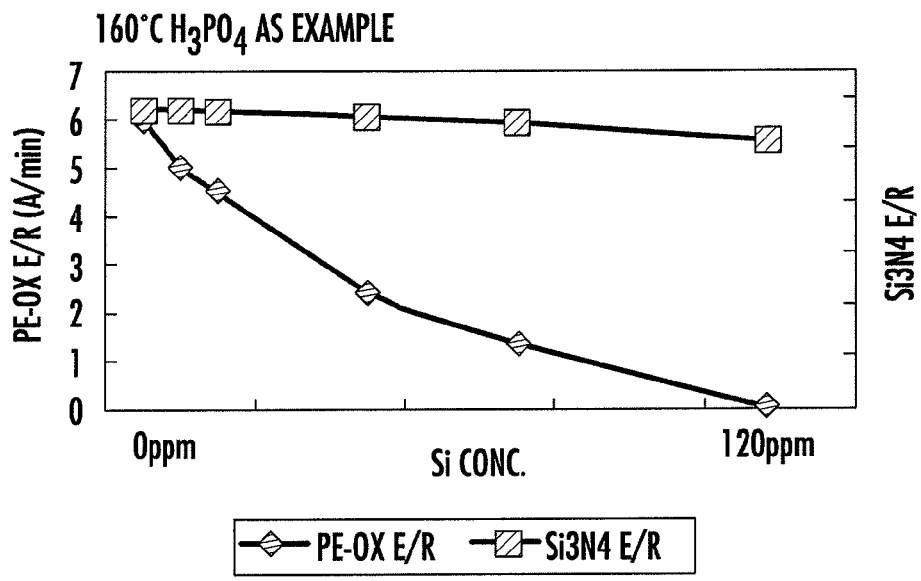
Figure 14:
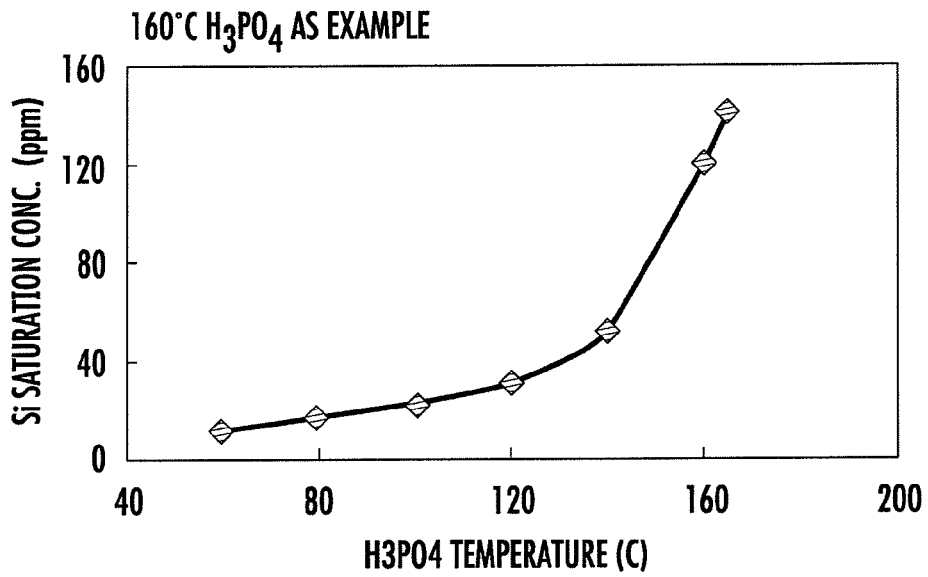
Figure 15:
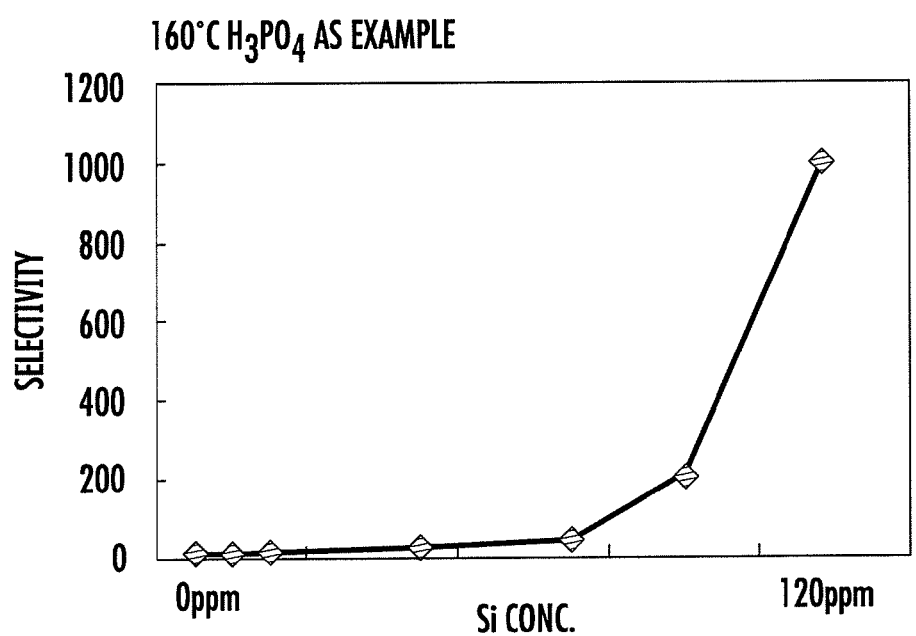
Figure 16:
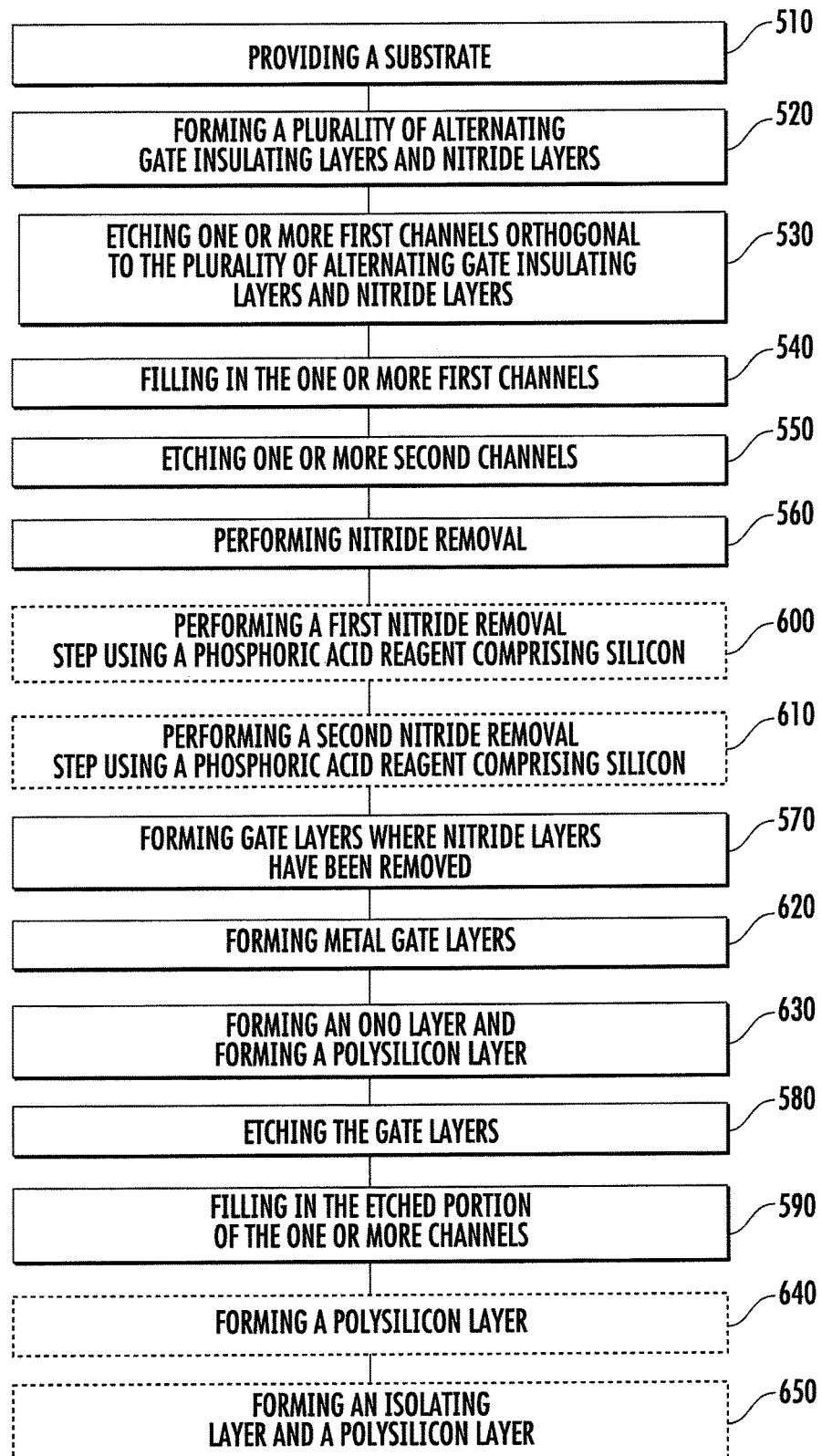

FIG. 4 provides an alternative view of a vertical memory cell comprising alternating gate insulating layers and nitride layers in accordance with embodiments of the present invention after etching one or more second channels;

FIG. 5 illustrates a cross-sectional view of a vertical memory cell after a first nitride removal step and a second nitride removal step in accordance with embodiments of the present invention;

FIG. 6a illustrates a top view of a vertical memory cell after one or more nitride removal steps in accordance with embodiments of the present invention;

FIG. 6b illustrates a cross-sectional view of the vertical memory cell in accordance with embodiments of the present invention;

FIG. 7 illustrates a cross-sectional view of a vertical memory cell after formation of metal gate layers in accordance with embodiments of the present invention;

FIG. 8a illustrates a top view of a vertical memory cell after deposition of an insulating layer in accordance with embodiments of the present invention;

FIG. 8b illustrates a cross-sectional view of a vertical memory cell after deposition of an insulating layer in accordance with embodiments of the present invention;

FIG. 9a illustrates a top view of a vertical memory cell after gate formation in accordance with embodiments of the present invention;

FIG. 9b illustrates a cross-sectional view of a vertical memory cell after gate formation in accordance with embodiments of the present invention;

FIG. 10a illustrates a top view of a vertical memory cell after gate isolation in accordance with embodiments of the present invention;

FIG. 10b illustrates a cross-sectional view of a vertical memory cell after gate isolation in accordance with embodiments of the present invention;

FIG. 11a provides a SEM image of a conventional vertical memory cell;

FIG. 11b illustrates the word line resistance of a conventional vertical memory cell;

FIG. 12a provides a SEM image of a vertical memory cell prepared in accordance with embodiments of the present invention;

FIG. 12b illustrates the word line resistance of a vertical memory cell prepared in accordance with embodiments of the present invention;

FIG. 13 illustrates the relationship between silicon concentration and plasma-enhanced silicon oxide [PE-OX] as well as the relationship between silicon concentration and silicon nitride etch rate in accordance with embodiments of the present invention;

FIG. 14 illustrates the relationship between the temperature of the reagent and the silicon saturation concentration in the reagent in accordance with embodiments of the present invention;

FIG. 15 illustrates the relationship between silicon concentration in the reagent and the nitride/gate insulating layer selectivity of the reagent; and FIG. 16 provides a flowchart of a method of preparing vertical memory cells in accordance with embodiments of the present invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a gate insulating layer" includes a plurality of such gate insulating layers.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about," when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

In the semiconductor industry, there is an increased desire to improve the capacity of semiconductor devices. Previously, increases in transistor density were largely achieved by the miniaturization of the transistor itself. However, there is a physical limit to the degree of miniaturization that is possible. In an attempt to continue to integrate more transistors on a single device, the concept of vertical devices, also known as 3D devices, has gained momentum. That is, while traditional transistors are made with the source, drain and gate region horizontally oriented, vertical memory cells build these features in the vertical direction, thereby reducing the horizontal footprint of each device. However, it has been found that in the production of conventional vertical memory cells, voids may be formed in the gates. These voids may lead to increased word line resistance and, thus, hinder the efficiency of the memory cell.

There remains a need in the art for alternative memory device structures and methods of preparing those structures that reduce the occurrence of voids in gate layers and reduce the word line resistance.

The present inventors have found that by forming gate layers in accordance with the processes disclosed herein, such as the nitride removal steps with a reagent as defined herein, improved gate fill-in, reduced void formation in the gate layers, and improved word line resistance can be obtained.

Non-volatile memory refers to a semiconductor device which is able to store information even when the supply of electricity is removed from the memory. Non-volatile memory includes, without limitation, Mask Read-Only Memory, Programmable Read-Only Memory, Erasable Programmable Read-Only Memory, Electrically Erasable Programmable Read-Only Memory, and Flash Memory, such as NAND and NOR devices.

Figure 1A:
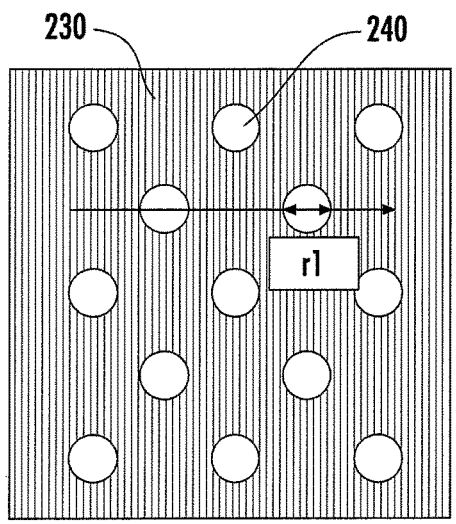
FIG. 1a illustrates a top view of a vertical memory cell after etching one or more first channels in the cell in accordance with embodiments of the present invention.
Figure 1B:
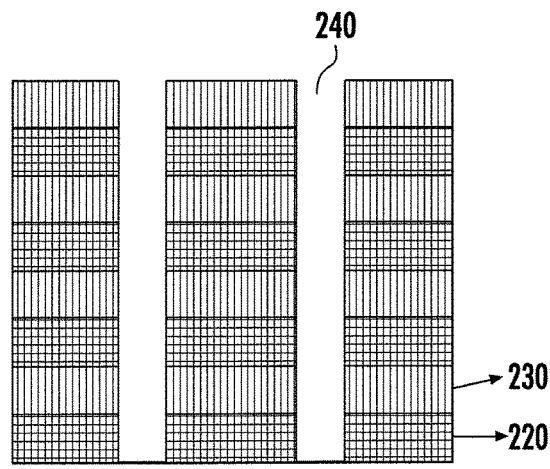
FIG. 1b illustrates a cross-sectional view of a vertical memory cell after etching one or more first channels in the cell in accordance with embodiments of the present invention.

In certain embodiments, such as that illustrated in FIGS. 1a and 1b, a vertical memory cell may be provided comprising alternating gate insulating layers 220 and nitride layers 230 over a substrate 210. FIG. 1a illustrates a top view of a vertical memory cell after etching one or more first channels in the cell in accordance with embodiments of the present invention. FIG. 1b illustrates a cross-sectional view of a vertical memory cell after etching one or more first channels in the cell in accordance with embodiments of the present invention. As also illustrated in these figures, in some embodiments, the memory cell comprises one or more channels 240 orthogonal to the gate insulating layers 220 and nitride layers 230. In this embodiment, the memory cell comprises a plurality of gate insulating layers and nitride layers where the gate insulating layers and nitride layers are disposed along the substrate alternating one over the other.

The substrate may include any underlying material or materials upon which a device, a circuit, an epitaxial layer, or a semiconductor may be formed. Generally, a substrate may be used to define the layer or layers that underlie a semiconductor device or even forms the base layer of a semiconductor device. Without intending to be limiting, the substrate may include one or any combination of silicon, doped silicon, germanium, silicon germanium, semiconductor compounds, or other semiconductor materials.

The gate insulating layers may comprise any suitable dielectric material, such as silicon oxide ($SiO_2$), silicon oxynitride ($SiO_xN_y$), or any combination thereof. One or more gate insulating layers may be formed by any suitable deposition process, such as chemical vapor deposition (CVD) or spin-on dielectric processing. In certain embodiments, one or more gate insulating layers may be grown on the substrate.

The nitride layers may comprise any suitable material comprising nitrogen, such as silicon nitride ($Si_3N_4$).

In certain embodiments of the present invention, the gate insulating layers and nitride layers may be referred to as "alternating." As used herein, "alternating" refers to the layering of a gate insulating layer followed by a nitride layer. One or more gate insulating layers may be formed followed by one or more nitride layers. One or more nitride layers may then be followed by the formation of one or more gate insulating layers. In certain embodiments, this alternating pattern is repeated several times to form a vertical memory cell array. When the cell comprises at least one repeated pattern of alternating gate insulating layer followed by a nitride layer, the alternating layers may be referred to as a "plurality" of the individual alternating layers.

In some embodiments, channels may be formed that are perpendicular to the alternating gate insulating layers and nitride layers. The one or more channels may be etched into the gate insulating layers and nitride layers such that a trench, or channel, is formed orthogonal to the alternating layers. The first set of channels etched into the alternating gate insulating layers and nitride layers may be referred to as the "first channel(s)." As shown in FIG. 1a, the first set of channels may have a radius "r1."

Figure 2A:
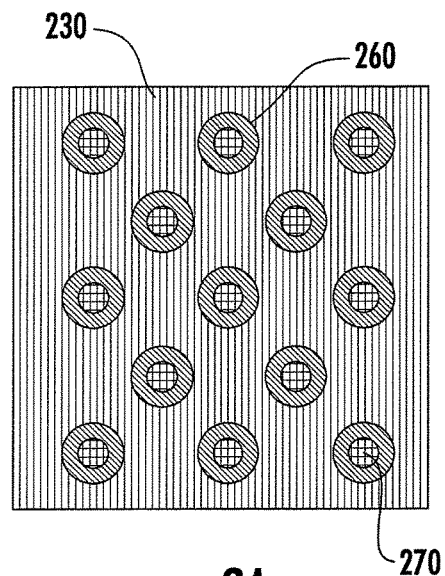
FIG. 2a illustrates a top view of a vertical memory cell after one or more first channels are filled in accordance with embodiments of the present invention.
Figure 2B:
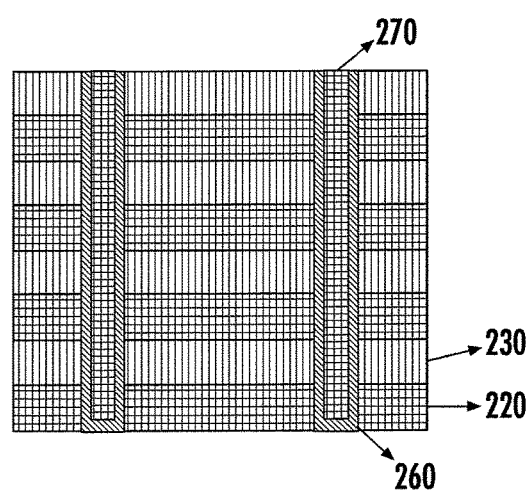
FIG. 2b illustrates a cross-sectional view of a vertical memory cell after one or more first channels are filled in accordance with embodiments of the present invention.

In some embodiments, one or more of the first channels may be filled. In certain embodiments, one or more of the first channels may be filled with a first conductive layer 260 and a gate sealing layer 270. FIG. 2a illustrates a top view of a vertical memory cell after one or more first channels are filled in accordance with embodiments of the present invention. FIG. 2b illustrates a cross-sectional view of a vertical memory cell after one or more first channels are filled in accordance with embodiments of the present invention. The first conductive layer may comprise any conductive material such as polysilicon. The gate sealing layer may comprise any insulating layer such as silicon oxide ($SiO_2$), silicon oxynitride ($SiO_xN_y$), or any combination thereof. For structures with high aspect ratios, one or more of the first channels may comprise a first conductive layer with a thickness gradient. For example, the thickness of the first conductive layer may be larger near the top of the channel compared to the thickness of the first conductive layer near the bottom of the channel. In other words, the radius of one or more of the first channels may be larger at the top of the channel compared to the radius of the channel at the bottom of the channel.

Figure 3A:
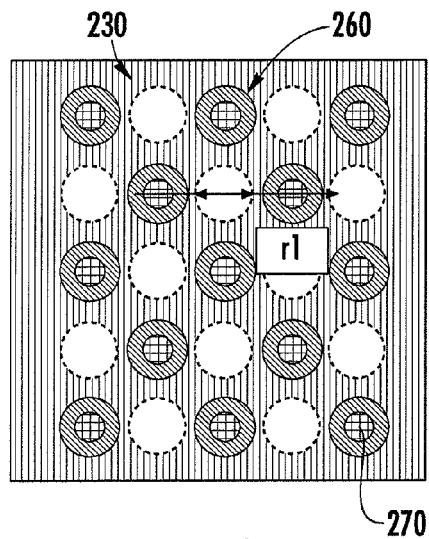
FIG. 3a illustrates a top view of a vertical memory cell after etching one or more second channels in accordance with other embodiments of the present invention.
Figure 3B:
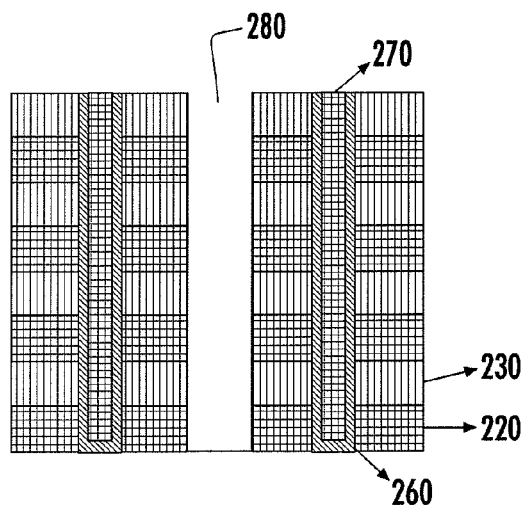
FIG. 3b illustrates a cross-sectional view of a vertical memory cell after etching one or more second channels in accordance with embodiments of the present invention.

In some embodiments, a second set of channels may be formed in the vertical memory cell. FIG. 3a illustrates a top view of a vertical memory cell after etching one or more second channels in accordance with other embodiments of the present invention. FIG. 3b illustrates a cross-sectional view of a vertical memory cell after etching one or more second channels in accordance with embodiments of the present invention. The second set of channels 280 may be etched orthogonal to the alternating gate insulating layers 220 and nitride layers 230. FIG. 3a illustrates a possible arrangement of the second set of channels in accordance with certain embodiments of the invention. The second set of channels may have a radius "r2" such that r2 is greater than r1.

FIG. 4 provides an alternative view of a vertical memory cell comprising alternating gate insulating layers and nitride layers in accordance with embodiments of the present invention after etching one or more second channels. In the embodiment illustrated in FIG. 4, the memory cell comprises a substrate 210, gate insulating layers 220, and nitride layers 230. As also illustrated in the embodiment of FIG. 4, the memory cell comprises a channel 280 orthogonal to the gate insulating layers 220 and nitride layers 230. In this embodiment, the memory cell comprises a plurality of gate insulating layers and nitride layers where the gate insulating layers and nitride layers are disposed along the substrate alternating one over the other.

In certain embodiments, a first nitride removal step may be performed to remove some or all of the nitride layers. In some embodiments, a first and a second nitride removal step may be performed to remove the nitride layers between gate insulating layers. FIG. 5 illustrates a cross-sectional view of a vertical memory cell after a first nitride removal step and a second nitride removal step in accordance with embodiments of the present invention. In the embodiment illustrated in FIG. 5, the memory cell comprises a substrate 210 and gate insulating layers 220. In FIG. 5, the first nitride removal step removes at least a portion of one or more gate insulating layers and at least a portion of one or more nitride layers. In certain embodiments, the first nitride removal step may remove part or all of a nitride layer, while the first nitride removal step removes only a portion of one or more gate insulating layers. In FIG. 5, the second nitride removal step removes the remaining nitride material in the nitride layers. For instance, in certain embodiments, it may be desired to form spaces between adjacent gate insulating layers of less than about 500 Å or more than about 100 Å, such as about 400 Å. In the embodiment illustrated in FIG. 5, the memory cell comprises spaces between adjacent gate insulating layers 220 of a dimension D1.

In practice, the memory cell may comprise rounded edges. FIG. 6a illustrates a top view of a vertical memory cell after one or more nitride removal steps in accordance with other embodiments of the present invention where the one or more nitride removal steps results in rounded gate insulating layers. FIG. 6b illustrates a cross-sectional view of the vertical memory cell in accordance with this embodiment of the present invention. As shown in FIG. 6b, the one or more nitride removal steps results in one or more rounded gate insulating layers. In certain embodiments, a first nitride removal step may create rounded edges in the gate insulating layers by removing a portion of the gate insulating layers. In some embodiments, the composition of the reagent may be modified to increase the etching rate of the gate insulating layers and create more rounded edges and/or increase the width of the resulting spaces between adjacent gate insulating layers. For instance, by using a reagent in the first nitride removal step that has a larger etching rate for the gate insulating layer, more of the gate insulating layer may be removed creating rounder corners and a larger window for subsequent gate deposition.

In some embodiments, the first nitride removal step comprises application of a reagent to the memory cell. In some embodiments, the reagent used in the first nitride removal step has an etching rate of nitride to gate insulating material of about 100:1 to about 50:1. For instance, in some embodiments, the nitride to gate insulating material etching rate is about 90:1 to 70:1, such as about 85:1 to 75:1, preferably about 80:1.

In certain embodiments, the reagent may comprise phosphoric acid and silicon. Conventional reagents typically comprise 85% phosphoric acid. In certain embodiments of the present invention, the concentration of silicon may be less than about 120 ppm, such as about 100 ppm or less, such as about 90 ppm or less. In certain embodiments, the concentration of silicon in the reagent is about 80 ppm. The inventors have found that the preferable amount of gate insulating layer may be removed in the first nitride removal step with a reagent having a silicon concentration of about 80 ppm. For instance, in embodiments where the gate insulating layer comprises silicon oxide, the following equations illustrate that with increasing concentration of silicon in the reagent, less silicon oxide may be removed.

$$3Si_3N_4 + 4H_3PO_4 + 18H_2O \leftrightarrow 4(NH_4)_3PO_4 + 9SiO_2 \quad (1)$$

$$SiO_2 + 4H^+ + 4e^- \leftrightarrow Si + 2H_2O \quad (2)$$

The first equation, Equation 1, describes the etching mechanism of silicon nitride by phosphoric acid. Silicon nitride, phosphoric acid, and water are the reactants and ammonium phosphate and silicon dioxide are the products. As shown in Equation 1, by increasing phosphoric acid or water, the etching rate of silicon nitride will increase. Equation 2 illustrates that increasing the silicon concentration will suppress the decomposition of silicon dioxide to silicon, and may thereby also result in a lower etching rate of silicon nitride in Equation 1.

The first nitride removal step may be performed at any suitable temperature, for instance from about 120-170° C., preferably from about 140-160° C., more preferably at about 150° C. The present inventors have found that when the reagent is applied at these temperatures, at least a portion of the gate insulating layers and the nitride layers may be removed providing a wider area for subsequent gate deposition. For instance, high temperature may accelerate the chemical reaction of silicon oxide (silicon oxide will react with hydrogen and make hydrated silicon and water). By controlling the concentration of silicon dissolved in the reagent, the inventors have found the reaction can be controlled. Certain amounts of silicon etching, such as no silicon etching, can be obtained. The inventors have also found that if the concentration of silicon in the reagent is over the saturation point, oxide may redeposit. With these factors in mind, the inventors can control the etching of the vertical memory cell with the disclosed reagent.

FIG. 13 illustrates the relationship of etching rate (E/R) between silicon concentration and plasma-enhanced silicon oxide [PE-OX] as well as the relationship between silicon concentration and nitride etch rate in accordance with embodiments of the present invention. In the embodiment illustrated by FIG. 13, the gate insulating layers comprises silicon oxide and the nitride layers comprise silicon nitride. In this embodiment, the silicon nitride etching rate remains substantially constant as the silicon concentration in the phosphoric acid reagent is increased. In 160° C. phosphoric acid, the saturation point of silicon is about 120 ppm. As the concentration of silicon is increased in the reagent, the etching rate of silicon oxide decreases.

FIG. 14 illustrates the relationship between the temperature of the reagent and the silicon saturation concentration in the reagent in accordance with embodiments of the present invention. In this embodiment, as the temperature of the reagent ("H3PO4 temperature") increases, the saturation point of silicon in the phosphoric acid reagent increases as well.

FIG. 15 illustrates the relationship between silicon concentration in the reagent and the nitride/gate insulating layer selectivity of the reagent. In the embodiment illustrated in FIG. 15, the silicon nitride/silicon oxide selectivity increases as the concentration of silicon increases. In certain embodiments, the concentration of silicon can be increased by adding a silicon additive to the reagent and/or by etching with a silicon dummy wafer. By modifying the concentration of silicon during etching, the inventors have found they can control the etching rate of the nitride layer verse gate insulating layer.

In certain embodiments, it may be desirable to perform a second nitride removal step. In some embodiments, the reagent for the second nitride removal step may comprise phosphoric acid and silicon. The concentration of silicon may be greater than about 80 ppm, such as greater than about 90 ppm, such as about 100 ppm or more or about 110 ppm or more. In certain embodiments, the concentration of silicon in the reagent is about 120 ppm. The second nitride removal step may be performed at any suitable temperature, for instance from about 120-170° C., preferably from about 140-160° C., more preferably at about 150° C. The relationships between temperature, silicon concentration, and etching selectivity discussed with respect to the first nitride removal step applies to the second nitride removal step as well.

In some embodiments, in the second nitride removal step, the remaining nitride layers may be removed. Some of the nitride layers may be removed during the first nitride removal step while the rest of the nitride layers is removed during the second nitride removal step. Additional nitride removal steps may be performed to remove additional nitride and/or gate insulating material following these principles.

In certain embodiments, the second nitride removal step has a higher nitride to gate insulating layer etching rate such that substantially no gate insulating material is removed in the second nitride removal step. In some embodiments, the reagent used in the second nitride removal step has an etching rate of nitride to gate insulating material of about of about 100:1 to about 50:1. For instance, in some embodiments, the nitride to gate insulating material etching rate is about 90:1 to 70:1, such as about 85:1 to 75:1, preferably about 80:1. In certain embodiments, the silicon concentration is set to 120 ppm in 160° C. phosphoric acid reagent such that the gate insulating material loss is close to zero in the second nitride removal step. If needed, the reagent of the second nitride removal step may be modified to reduce the nitride to gate insulating layer etching rate to remove some gate insulating material in the gate insulating layers. Preferably, the gate insulating material and nitride material is removed to provide a space between adjacent gate insulating layers of a desired dimension. As shown in FIG. 5, the nitride removal steps may be modified to obtain a distance D1 between adjacent gate insulating layers.

As noted previously, the nitride removal step(s) may result in a rectangular shape (e.g., illustrated in FIG. 5) and/or rounded shape (e.g., illustrated in FIG. 6b). In certain embodiments, a rectangular shape may be achieved by using a one-step nitride removal process with a reagent with a high selectivity to nitride removal. In certain embodiments, a rounded shape may be achieved by using a two-step nitride removal process. In the two-step nitride removal process, nitride may be removed in the first step with substantially no gate insulating layer removal using a highly selective reagent. The second step may then remove any re-deposited silicon or gate insulating layer and modify the gate insulating layer profile with a standard reagent. These steps can also be switched to achieve the rounded shape. The selectivity of the reagent can be controlled by modifying the silicon concentration in the reagent and temperature of the reagent.

FIG. 7 illustrates a cross-sectional view of a vertical memory cell after formation of gate layers in accordance with embodiments of the present invention. In the embodiment illustrated in FIG. 7, the memory cell comprises a substrate 210, gate insulating layers 220, and gate layers 250. In certain embodiments, the spaces formed between adjacent gate insulating layers by the removal of gate insulating material and/or nitride material may be filled in with conductive material, such as metal. Filling in these spaces between adjacent gate insulating layers provides metal gates. In some embodiments, the metal gates comprise tungsten.

As shown in FIG. 7, the deposited metal fills the spaces between adjacent gate insulating layers. Due to the application of the one or more nitride removal steps performed in accordance with the above description, the metal gate fill-in is free of voids and thus has reduced word line resistance. Wet-etching may then take place to remove excess metal along the metal gate layers. The resulting memory cell is illustrated in FIG. 7. A material such as a second conductive material, which may comprise polysilicon, may then be used to fill in where the metal gate layer was etched.

In alternative embodiments, a second gate insulating layer may be formed over the profile after the nitride removal process. For instance, FIG. 8a illustrates a top view of a vertical memory cell after deposition of a second gate insulating layer in accordance with embodiments of the present invention. FIG. 8b illustrates a cross-sectional view of a vertical memory cell after deposition of a second gate insulating layer in accordance with embodiments of the present invention. In this embodiment, the second gate insulating layer may be an oxide-nitride-oxide layer. As shown in FIG. 8b, the second gate insulating layer 290 is formed along the grooves in the vertical memory cell.

In certain embodiments, after formation of an insulating layer along the profile of the vertical memory cell, one or more gates may be formed in the vertical memory cell. FIG. 9a illustrates a top view of a vertical memory cell after gate formation in accordance with embodiments of the present invention. FIG. 9b illustrates a cross-sectional view of a vertical memory cell after gate formation in accordance with embodiments of the present invention. The gate 300 may be formed by depositing any conductive material, such as polysilicon. The gate may be etched to an appropriate width. The gate may have a "gate-all-around" structure such that the gate material surrounds the channel region on all sides.

In certain embodiments, after gate formation, the gate may be isolated. FIG. 10a illustrates a top view of a vertical memory cell after gate isolation in accordance with embodiments of the present invention. FIG. 10b illustrates a cross-sectional view of a vertical memory cell after gate isolation in accordance with embodiments of the present invention. The gate may be isolated by forming a channel of any dielectric material, such as silicon oxide ($SiO_2$), silicon oxynitride ($SiO_xN_y$), or any combination thereof. As shown in FIGS. 10a and 10b, the isolating material 310 may be formed along the profile of the vertical memory cell. A second conductive layer 320, such as polysilicon, may be deposited along the isolating material 310.

The processing of the memory cell to its final form may continue as known to those of skill in the art. For instance, back-end of line processing may be performed to provide bit lines across the memory cell.

FIG. 11a provides a scanning electron microscopy (SEM) image of a conventional vertical memory cell. In FIG. 11a, a substrate 110 is provided with gate insulating layers 120 and gate layers 150, specifically metal gate layers in this image. The memory cell also includes channels 140 disposed along the substrate. As shown in FIG. 11a, in conventional vertical memory cells, voids 160 form along gate layers between gate insulating layers. The gate fill-in is not complete and voids are formed between adjacent gate insulating layers. These voids reduce the word line resistance. FIG. 11*b* illustrates the word line resistance of a conventional vertical memory cell. The x-axis is the sheet resistance, Rss (Ohm/Sq) and the y-axis is accumulation rate (%). The data was analyzed by a fitted normal distribution function on a cumulative normal distribution function plot.

FIG. 12*a* provides a SEM image of a vertical memory cell prepared in accordance with embodiments of the present invention. In FIG. 12*a*, a substrate 210 is provided with gate insulating layers 220 and gate layers 250, specifically metal gate layers in this image. The memory cell of FIG. 12*a* also includes a channel 280. FIG. 12*b* illustrates the word line resistance of a vertical memory cell prepared in accordance with embodiments of the present invention.

In sharp contrast to the conventional device of FIG. 11*a*, the gate layers of FIG. 12*a* are free of voids. That is, in the embodiment illustrated in FIG. 12*a*, the gate layers are completely filled in and do not have voids between adjacent gate insulating layers. The width of the gate layers is also greater than seen in conventional memory cells and has improved word line resistance. FIG. 12*b* illustrates the improvement in word line resistance for memory cells prepared in accordance with embodiments of the present invention. The x-axis is the sheet resistance, Rss (Ohm/Sq) and the y-axis is accumulation (%).

As also shown in FIG. 12*a*, the gate insulating layers 220 have rounded edges 330. In comparison, FIG. 5 illustrates gate insulating layers with straight edges while FIGS. 6*a* and 6*b* illustrate gate insulating layers with rounded edges.

Any of the processes, methods, or techniques as described herein may be used to accomplish any of these steps of the inventive method. Certain of the steps generally described above in the method may themselves comprise other substeps that have not necessarily been identified. Such additional steps are understood by a person of ordinary skill in the art having the benefit of this disclosure.

FIG. 16 provides a flowchart of a method of preparing vertical memory cells in accordance with embodiments of the present invention. In the embodiment illustrated in FIG. 16, the method of preparing vertical memory cells comprises providing a substrate 510, forming a plurality of alternating gate insulating layers and nitride layers 520, and etching one or more first channels orthogonal to the plurality of alternating gate insulating layers and nitride layers 530. The method additionally comprises filling in the one or more first channels 540 and etching one or more second channels 550.

The method of preparing vertical memory cells in accordance with embodiments of the present invention further comprises performing nitride removal 560. The nitride removal step may comprise a first nitride removal step using a phosphoric acid reagent comprising silicon 600 and, in certain embodiments, a second nitride removal step using a phosphoric acid reagent comprising silicon 610.

In certain embodiments, the method of preparing vertical memory cells may also comprise forming gate layers where nitride layers have been removed 570, etching the gate layers 580, and filling in the etched portion of the one or more channels 590. In certain embodiments of the invention, the forming gate layers may comprise depositing metal gate layers 620 while in other embodiments, forming gate layers may comprise depositing an ONO layer followed by a polysilicon layer 630. Filling in the etched portion may comprise forming a polysilicon layer 640 or may comprise forming an isolating layer and a polysilicon layer 650.

The present invention may be used for the fabrication of any memory device. For instance, the method of the present invention may be applied to the fabrication of any non-volatile memory device, such as NAND flash memory devices, NOR flash memory devices, or logic devices. Certain embodiments may not be appropriate for MASK read-only memory devices.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of manufacturing a vertical memory cell comprising:
   providing a substrate;
   forming a plurality of alternating gate insulating layers and nitride layers;
   etching one or more channels orthogonal to the plurality of alternating gate insulating layers and nitride layers;
   performing a first nitride removal step using a phosphoric acid reagent comprising silicon to form a first space having a first width; and
   performing a second nitride removal step using a phosphoric acid reagent to form a second space having a second width,
   wherein the first width is larger than the second width.

2. The method of manufacturing a vertical memory cell according to claim 1, wherein the first nitride removal step comprises applying the reagent to the plurality of alternating gate insulating layers and nitride layers at about 140-160° C.

3. The method of manufacturing a vertical memory cell according to claim 1, further comprising a second nitride removal step using a phosphoric acid reagent comprising silicon.

4. The method of manufacturing a vertical memory cell according to claim 1, wherein the reagent in the first nitride removal step has a nitride to gate insulating layer etching rate of about 100:1 to 60:1.

5. The method of manufacturing a vertical memory cell according to claim 1, wherein the second nitride removal step comprises applying the reagent to the plurality of alternating gate insulating layers and nitride layers at about 140-160° C.

6. The method of manufacturing a vertical memory cell according to claim 1, wherein the reagent in the first nitride removal step comprises a silicon concentration of about 80 ppm.

7. The method of manufacturing a vertical memory cell according to claim 1, wherein the reagent in the second nitride removal step comprises a silicon concentration of about 120 ppm.

8. The method of manufacturing a vertical memory cell according to claim 1, wherein performing the first nitride removal step comprises forming one or more rounded edges of one or more gate insulating layers.

9. The method of manufacturing a vertical memory cell according to claim 1 further comprising forming metal gate layers where nitride layers have been removed.

10. The method of manufacturing a vertical memory cell according to claim 9, wherein the metal gate layers comprise tungsten.

11. The method of manufacturing a vertical memory cell according to claim 1, further comprising forming an oxide-nitride-oxide layer after the nitride removal step.

12. The method of manufacturing a vertical memory cell according to claim 1, wherein at least a portion of one or more gate insulating layers and nitride layers is removed to form one or more spaces along the alternating layers, wherein the spaces are about 400 Å wide.

13. The method of manufacturing a vertical memory cell according to claim 1, further comprising depositing conductive material in the one or more channels.

14. A method of manufacturing a vertical memory cell comprising:
   providing a substrate;
   forming a plurality of alternating gate insulating layers and nitride layers;
   etching one or more channels orthogonal to the plurality of alternating gate insulating layers and nitride layers; and
   performing a first nitride removal step using a phosphoric acid reagent comprising silicon,
   wherein the reagent in the first nitride removal step has a nitride to gate insulating layer etching rate of about 100:1 to 60:1.

15. A method of manufacturing a vertical memory cell comprising:
   providing a substrate;
   forming a plurality of alternating gate insulating layers and nitride layers;
   etching one or more channels orthogonal to the plurality of alternating gate insulating layers and nitride layers; and
   performing a first nitride removal step using a phosphoric acid reagent comprising silicon,
   wherein the reagent in the first nitride removal step comprises a silicon concentration of about 80 ppm.

* * * * *